(12) United States Patent
Tan et al.

(10) Patent No.: US 7,314,811 B2
(45) Date of Patent: Jan. 1, 2008

(54) METHOD TO MAKE CORNER CROSS-GRID STRUCTURES IN COPPER METALLIZATION

(75) Inventors: Patrick Tan, Singapore (SG); Kheng Chok Tee, Selangor (MY); David Vigar, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 105 days.

(21) Appl. No.: 10/793,402

(22) Filed: Mar. 4, 2004

(65) Prior Publication Data

US 2005/0196938 A1 Sep. 8, 2005

(51) Int. Cl.
*H01L 21/20* (2006.01)
(52) U.S. Cl. .................. 438/462; 438/113; 438/637; 438/926; 257/48; 257/E21.575; 257/620
(58) Field of Classification Search ............. 438/462, 438/113, 637, 926; 257/48, E21.575, 620
See application file for complete search history.

(56) References Cited

U.S. PATENT DOCUMENTS

| 4,928,162 | A |   | 5/1990  | Lesk et al. ............. 357/72 |
| 5,572,067 | A | * | 11/1996 | Thalapaneni ........... 257/669 |
| 5,846,874 | A | * | 12/1998 | Hartranft et al. ........ 438/598 |
| 6,022,792 | A |   | 2/2000  | Ishii et al. .............. 438/462 |
| 6,479,887 | B1 |  | 11/2002 | Yoon et al. ............. 257/666 |
| 6,528,392 | B2 | * | 3/2003 | Feurle et al. ........... 438/460 |
| 2002/0043700 | A1 | * | 4/2002 | Sasaki et al. ........... 257/620 |
| 2004/0002198 | A1 | * | 1/2004 | Lee et al. ............... 438/460 |
| 2004/0121577 | A1 | * | 6/2004 | Yu et al. ................ 438/622 |

* cited by examiner

*Primary Examiner*—B. William Baumeister
*Assistant Examiner*—Steven J. Fulk
(74) *Attorney, Agent, or Firm*—Saile Ackerman LLC; Stephen B. Ackerman; Rosemary L. S. Pike

(57) ABSTRACT

A new method to prevent cracking at the corners of a semiconductor die during dicing is described. Dummy metal structures are fabricated at the corners of the die to prevent cracking. The design for the dummy metal structures can be generated automatically by a computer program.

27 Claims, 6 Drawing Sheets

METHOD TO MAKE CORNER CROSS-GRID STRUCTURES IN COPPER METALLIZATION

BACKGROUND OF THE INVENTION

(1) Field of the Invention

The invention relates to a method of metallization in the fabrication of integrated circuits, and more particularly, to a method of forming dummy structures at the corners of the die thereby preventing stress-induced cracking at the corners of the die in the manufacture of integrated circuits.

(2) Description of the Prior Art

After semiconductor device fabrication has been completed on a wafer, the wafer is separated into individual integrated circuit chips. During singulation, or wafer sawing, mechanical damage may occur, resulting in chipping or delamination. These chips can act as nucleation sites for stress-induced cracking. The cracks can then propagate into the die and eventually cause failure of the circuitry, especially after temperature excursions. The delamination can result in separation of the die layers and result in contaminant, usually moisture, incursion and eventually device failure.

To reduce RC delay, the copper damascene process has been implemented along with low dielectric constant (k) dielectric material. Due to the thermal mis-match between the low-k material and silicon, physical considerations such as adhesion, stress, and shear become crucial for advanced technology. During packaging, the corners of the die exhibit high stress and tend to crack. Therefore, it is important to fabricate some dummy structures to prevent delamination and crack propagation even for flip-chip and bump products.

U.S. Pat. No. 4,928,162 to Lesk et al discloses formation of dummy metal topographical configurations at the corners of a semiconductor die in order to prevent cracking and delamination at the corners. U.S. Pat. No. 6,022,792 to Ishii et al teaches forming dummy bump electrodes around the periphery of a substrate. U.S. Pat. No. 6,479,887 to Yoon et al shows a circuit pattern tape including dummy structures.

SUMMARY OF THE INVENTION

A principal object of the present invention is to provide an effective and very manufacturable method of forming integrated circuit devices without cracking at the corners of the semiconductor die in the fabrication of integrated circuit devices.

Another object of the invention is to prevent cracking at the corners of a semiconductor die by fabricating dummy metal structures at the corners of the die.

Yet another object of the invention is to prevent cracking at the corners of a semiconductor die by fabricating dummy metal structures at the corners of the die wherein the structures are anchored to both the dummy active area and to polysilicon.

A further object of the invention is to provide a computer program for designing a layout of dummy metal structures to prevent cracking at the corners of a semiconductor die.

In accordance with the objects of this invention a new method to prevent cracking at the corners of a semiconductor die by fabricating dummy metal structures at the corners of the die is achieved.

BRIEF DESCRIPTION OF THE DRAWINGS

In the accompanying drawings forming a material part of this description, there is shown.

DESCRIPTION OF THE PREFERRED EMBODIMENTS

The present invention provides a method for generating dummy structures at the corners of a semiconductor die to prevent delamination and cracking of the die layers. The layout design of the dummy structures can be performed, for example, by a computer program. This invention is particularly important in the copper damascene process, especially when the intermetal dielectric material is a low dielectric constant (k) material. Delamination during wafer processing can also be prevented by the process of the invention.

Figure 1:
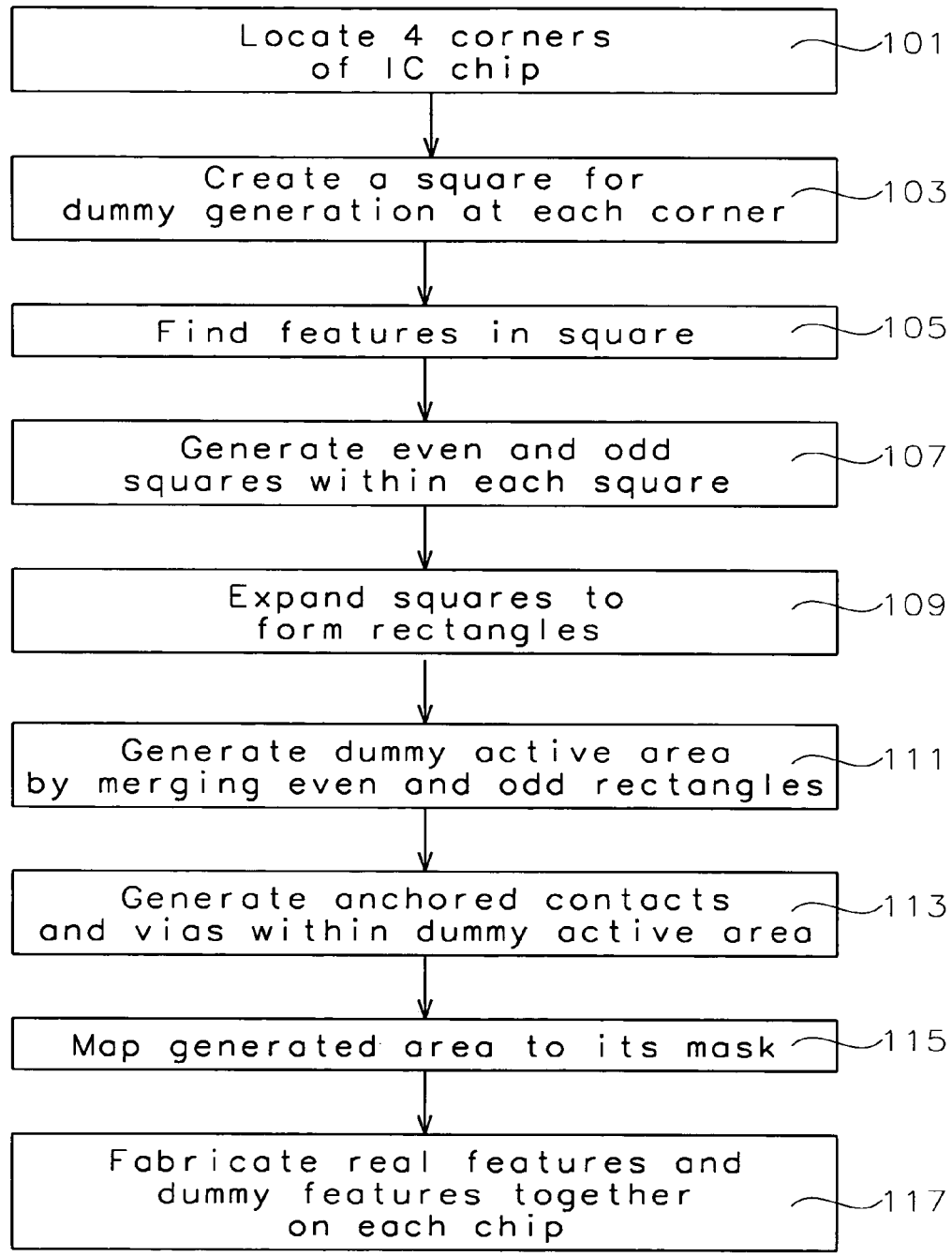
FIG. 1 is a flowchart of the process of the present invention.
Figure 2:
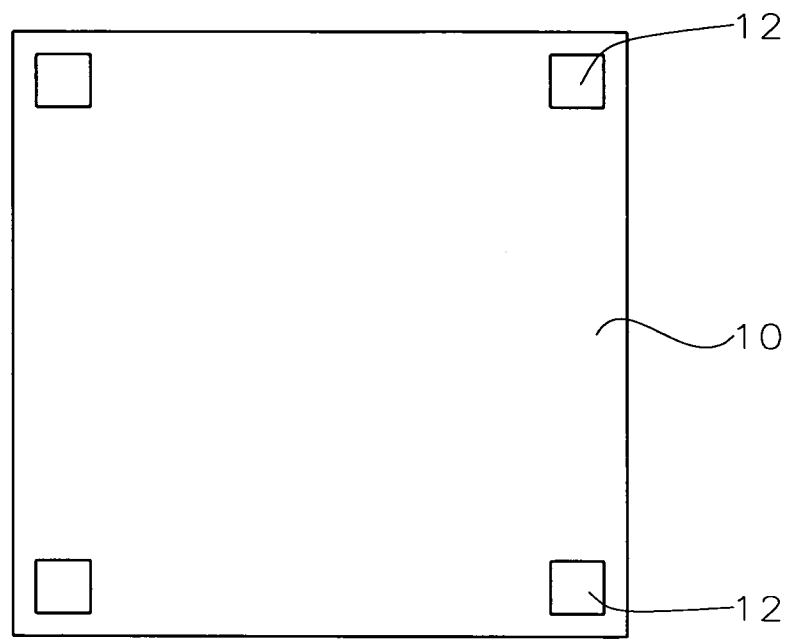
FIG. 2 is a top view illustration of a semiconductor die.

Referring now more particularly to FIG. 1, there is shown the flowchart of the process of the present invention. FIG. 2 shows a semiconductor die 10 having corner regions 12. A plurality of semiconductor dies, or integrated circuits, are formed on each wafer. During singulation, the semiconductor dies are separated such as by wafer dicing or sawing. The steps in the flowchart of FIG. 1 are carried out for each of the integrated circuit chips on the wafer.

Step 101 of FIG. 1 locates the four corners of the integrated circuit chip. This can be done automatically based on a measurement of "corner size" which is user defined. In step 103, a square is created for dummy structure generation at each corner. These squares are shown as 12 in FIG. 2. For example, the square 12 may be 154×154 microns in area and may be placed 3 microns from the corners of the integrated circuit (IC).

Figure 3:
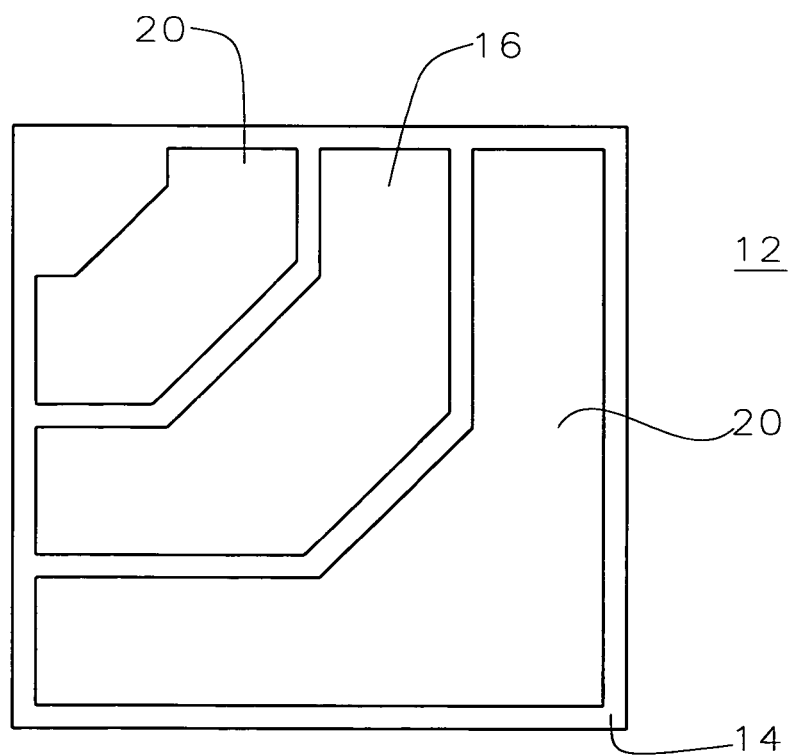
FIG. 3 is a top view illustration of a corner region of the semiconductor die in FIG. 2.

In step 105, the process looks for features within the square. FIG. 3 is an enlarged view of one of the corner regions 12 of the IC 10. For example, features; that is, real circuit structures, exist within the area labeled 16. Each corner is scanned separately. The features are sized up by an offset per side, for example, 10 microns, to ensure that the dummy grid is kept away from the real circuit features by the offset. The dummy grid will be generated in the empty areas 20. If no real circuit features are found in the square, the dummy grid will be generated to fill the entire square.

Figure 4:
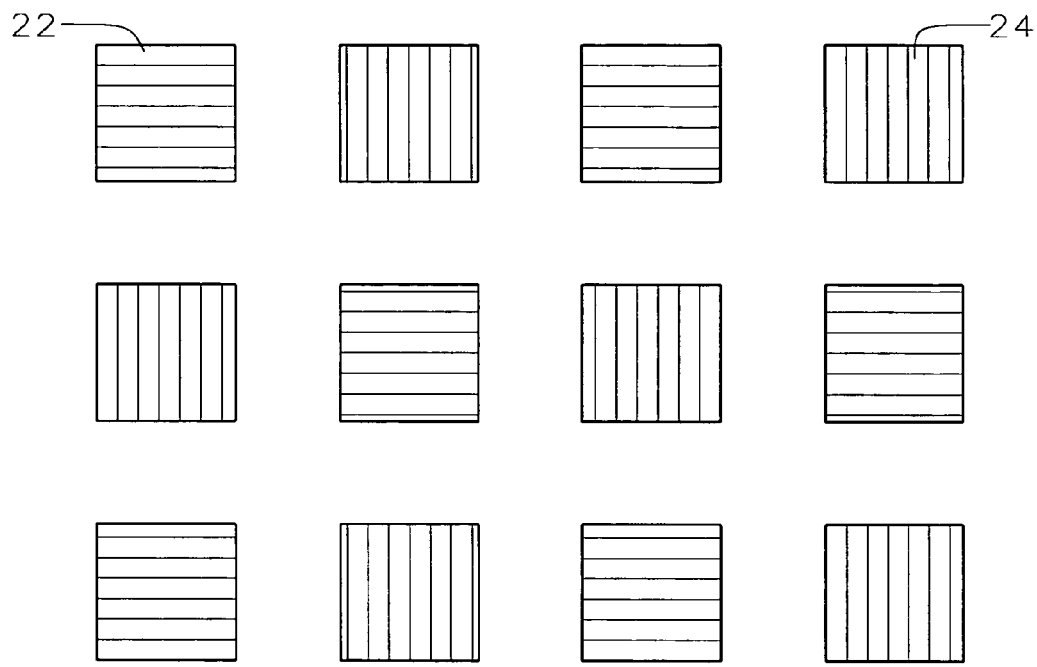
FIG. 4 is a top view illustration of odd and even squares.

In step 107, an alternating grid is generated. For example, the alternating squares of the grid may be called odd and even squares. FIG. 4 shows odd squares 22 and even squares 24. For example, odd squares are located in odd numbered metal layers (M1, M3, etc.) and even squares are located in even numbered metal layers (M2, M4, etc.). Squares are placed from 0.5 to 5.0 μm apart in the same level.

Figure 5:
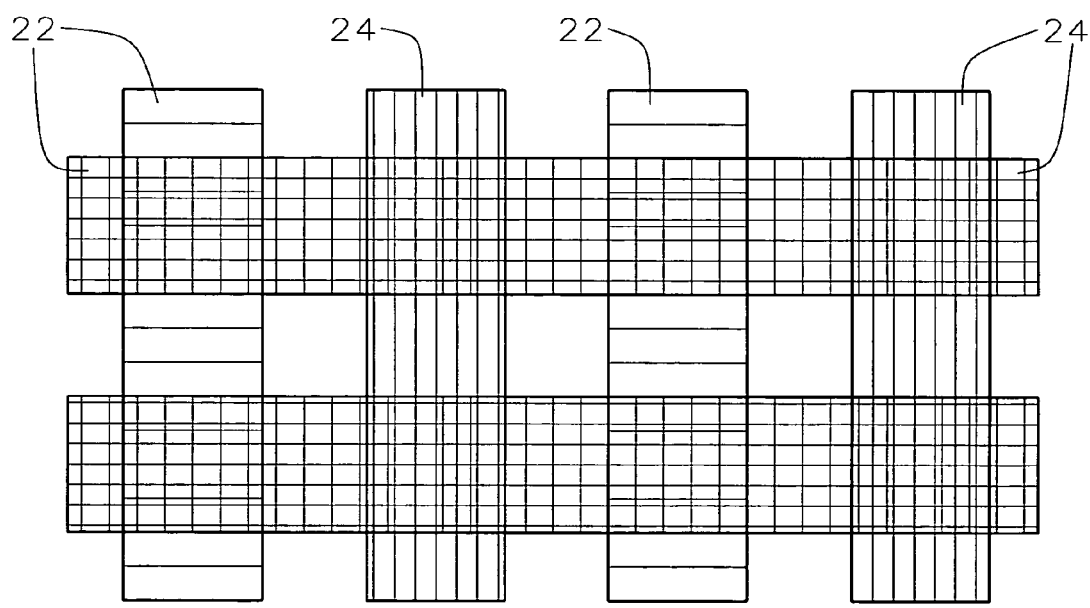
FIG. 5 is a top view illustration of the cross-grid dummy structure of the present invention.

The squares are expanded horizontally and vertically to form rectangles (step 109). In step 111, a dummy active area is generated by merging odd and even rectangles, as shown in FIG. 5, to form a grid. The dummy active areas are formed in areas 20 of FIG. 3.

Figure 6:
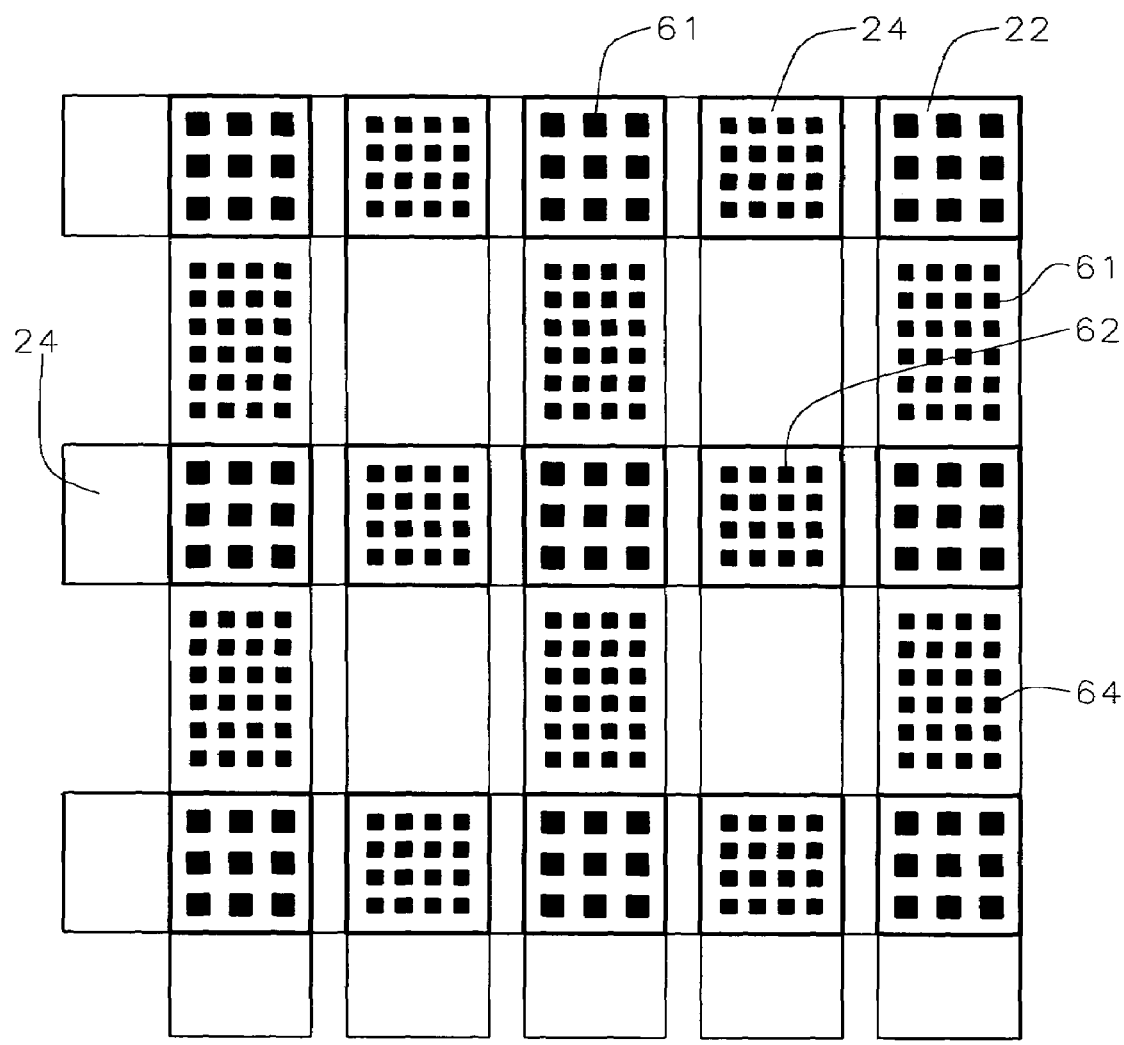
FIG. 6 is a detailed top view illustration of the cross-grid dummy structures generated in the process of the present invention.

FIG. 6 illustrates a portion of the completed grid in top view. Odd squares 22 and even squares 24 are shown. The edges of each of the odd squares are extended towards each other to form a grid. Having formed the grid, it is copied to the "Odd" metal layers, M1, M3, M5 etc. Like wise for the even squares, it forms a grid which is copied to all the "Even" POLY2 and metal layers, M2, M4, M6 etc. The grid shown in FIG. 6 is an example for POLY2 and M1. It will mean that M1, M3, M5 will be coincidently stacked vertically upwards. Similarly, POLY2, M2, M4, M6 will be coincidently stacked up vertically. These two stacks will interlace each other at alternate layers. Contacts to Poly2 are generated in the even squares. Contacts to the active area are generated in the odd squares. Odd vias are created within the odd squares and even vias are created within the even squares.

Figure 7:
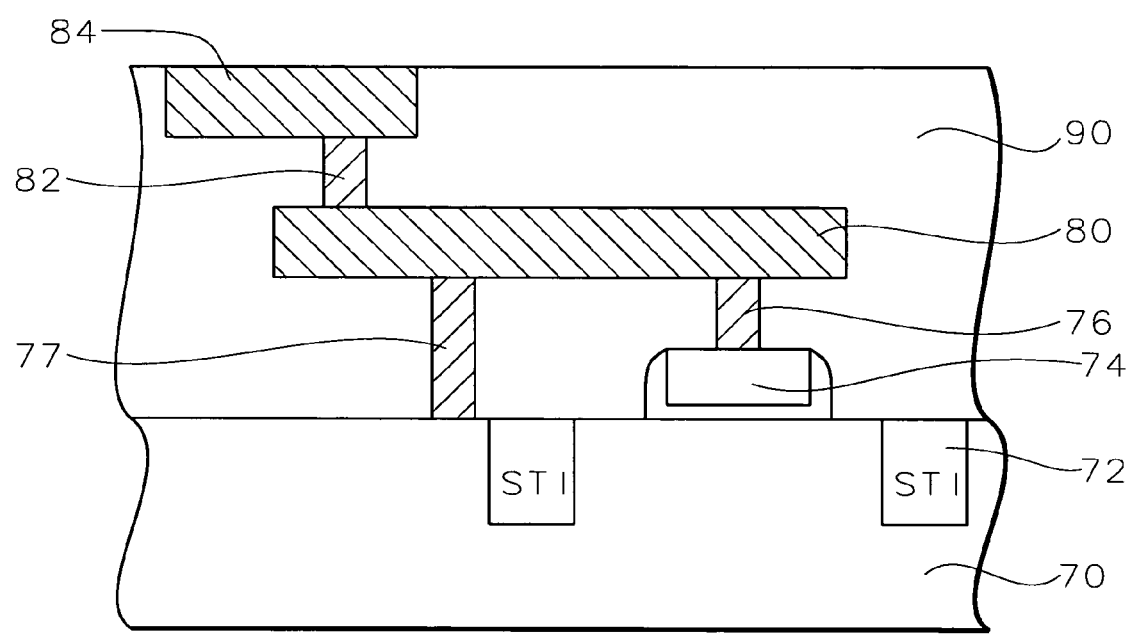
FIG. 7 is a cross-sectional representation of dummy corner structures of the present invention.

FIG. 7 illustrates semiconductor substrate 70 in which are formed shallow trench isolation (STI) regions 72. A dummy polysilicon gate electrode 74, for example, has been formed on the surface of the substrate. Dummy structures are shown here. Dummy metal line 80 is connected to the device structure 74 by via 76 and also to the active area by via 77. The lines 22 in FIG. 6 represent M1 metal line 80 in FIG. 7. The lines 24 in FIG. 6 represent the Poly 2 dummy gate 74 in FIG. 7. The contacts to Poly2 62 and contact to active area 64 on the left side of FIG. 6 correspond to vias 76 and 77 of FIG. 7, respectively. Vias 76 and 77 are the anchors by which the grids are held to the silicon. Anchoring the contacts to both the poly and the active area increases the mechanical strength holding the inter-layer dielectric 90. Second metal line 84 is connected to first metal line 80 by via 82. Vias 61 of FIG. 6 are vias connecting between M1 & M2. These correspond to vias 82 of FIG. 7. The dummy metal lines and vias may comprise copper, tungsten, or aluminum, for example. The cross-grid especially enhances the strength of low-k materials.

In step 115, the generated layer design is mapped to its respective mask. That is, the dummy structures are to be generated together with the device contact, via, and metal features. Finally, in step 117, the actual fabrication of the integrated circuit device is performed, including real circuit structures and dummy structures.

If the marking for corner stress is provided, steps 101 through 105 can be skipped. In this case, the computer program, for example, can immediately generate the dummy grid in the marked area to prevent corner stress.

Figure 8:
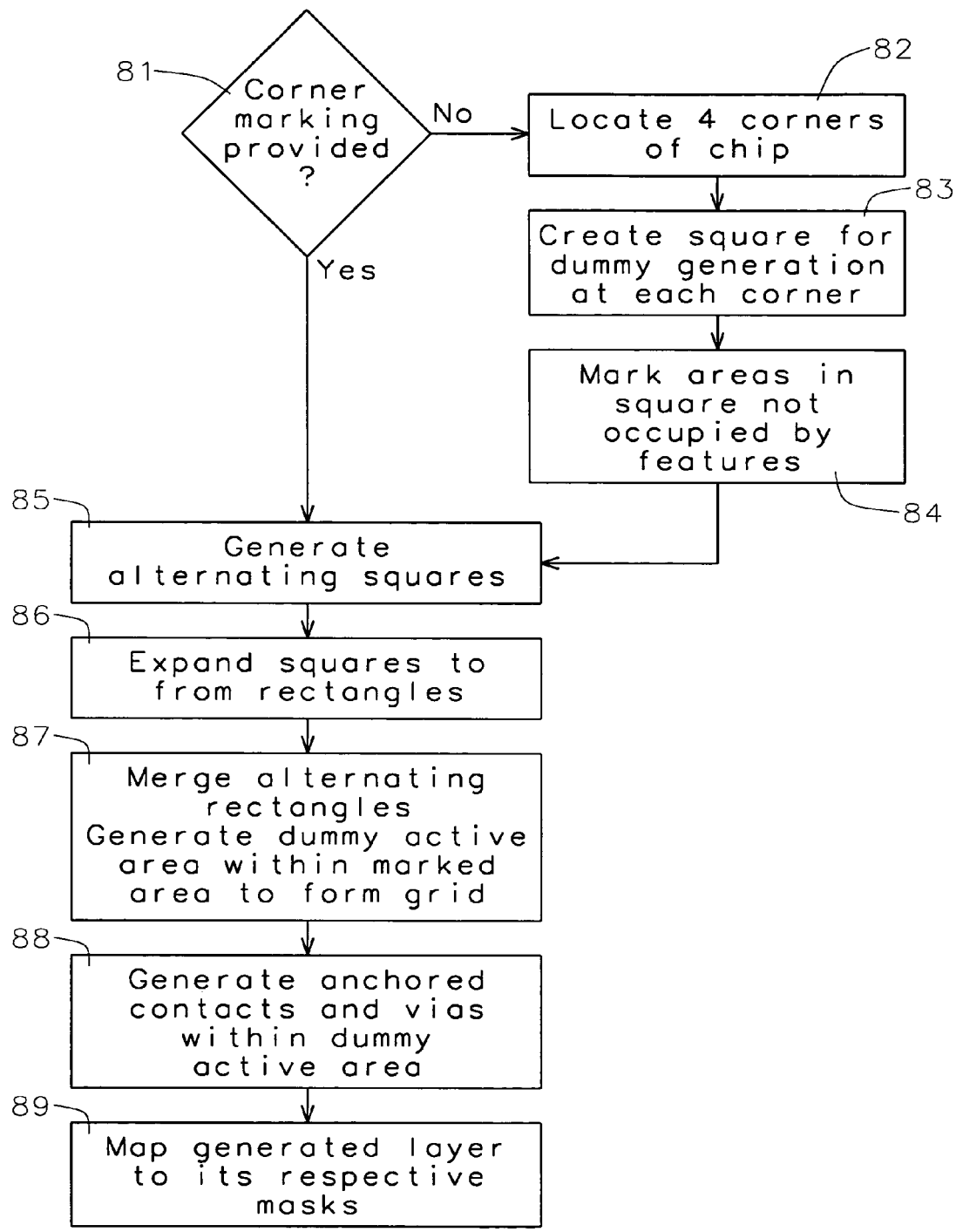
FIG. 8 is a flowchart of the computer program of the present invention.

FIG. 8 is a flowchart of the computer program of the present invention that is used to generate the dummy grid for corner stress relief in the present invention. If corner marking is not provided (81), the computer program will locate the four corners of the chip (82), create a square of a user-defined size for dummy generation at each corner (83), and mark areas in the square not occupied by real circuit features(84). If corner marking is provided (81), the program will proceed to step 85. In step 85, alternating dummy squares are generated. The squares are expanded to form rectangles (86). The rectangles are merged to generate a dummy active area within the marked area to form a grid (87). Anchored contacts and vias are generated within the dummy active area (88). Finally, the generated dummy layers are mapped to their respective masks.

After the computer program of the present invention is run, the integrated circuit device is fabricated, including real circuit structures and dummy structures.

The cross-grid design of the present invention prevents crack propagation and anchors the inter-metal dielectric between metal layers. This design is implemented only in the die corner so the main circuitry is unaffected. The design of the grid metal lines does not directly duplicate the previous layers; therefore, there is not a multiplication of topology. It would be undesirable to have a multiplication of topology especially on copper lines having a dishing problem.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:
   providing a plurality of integrated circuits on a wafer;
   fabricating a dummy structure in a corner region of each of said plurality of integrated circuits comprising:
      fabricating dummy semiconductor devices and dummy metal lines in the corner regions of said plurality of integrated circuits; wherein each of said dummy metal lines comprises a plurality of metal layers and wherein a lowest of said plurality of metal layers is connected by metal vias to both one of said dummy semiconductor devices and an active area of a substrate of one of said plurality of integrated circuits; and
      wherein said dummy metal lines prevent propagation of cracks in said corner regions of said integrated circuits.

2. The method according to claim 1 wherein said dummy metal lines comprise copper.

3. The method according to claim 1 wherein said metal layers and metal vias comprise copper, aluminum, or tungsten.

4. The method according to claim 1 further comprising separating said plurality of integrated circuits from one another.

5. The method according to claim 4, wherein said separating step comprises wafer sawing or wafer dicing.

6. The method according to claim 1 wherein low dielectric constant dielectric material separates conducting layers from one another.

7. The method according to claim 1 wherein delamination of metal layers during integrated circuit fabrication is also prevented by said dummy metal lines.

8. The method according to claim 1 wherein said dummy metal lines comprise an alternating dummy grid structure.

9. The method according to claim 1 wherein said dummy metal lines comprise odd and even via stacks connected to alternate metal layers and wherein each of said alternate metal layers connects to either said odd via stacks or said even via stacks.

10. A method of fabricating an integrated circuit device comprising:
    providing a plurality of integrated circuits on a wafer;
    fabricating a dummy structure in a corner region of each of said plurality of integrated circuits comprising:
       fabricating dummy polysilicon semiconductor devices and dummy metal lines in the corner regions of said plurality of integrated circuits wherein each of said dummy metal lines comprises a plurality of metal layers and wherein a lowest of said plurality of metal layers is connected by metal vias to both one of said dummy polysilicon semiconductor devices and an active area of a silicon substrate of one of said plurality of integrated circuits; and wherein said dummy metal lines prevent propagation of cracks in said corner regions of said integrated circuits.

11. The method according to claim 10 wherein said dummy metal lines comprise copper.

12. The method according to claim 10 wherein said metal layers and metal vias comprise copper, aluminum, or tungsten.

13. The method according to claim 10 wherein low dielectric constant dielectric material separates conducting layers from one another.

14. The method according to claim 10 wherein delamination of metal layers during integrated circuit fabrication is also prevented by said dummy metal lines.

15. The method according to claim 10 further comprising separating said plurality of integrated circuits from one another.

16. The method according to claim 15, wherein said separating step comprises wafer sawing or wafer dicing.

17. The method according to claim 10 wherein said dummy metal lines comprise an alternating dummy grid structure.

18. The method according to claim 10 wherein said dummy metal lines comprise odd and even via stacks connected to alternate metal layers and wherein each of said alternate metal layers connects to either said odd via stacks or said even via stacks.

19. An integrated circuit comprising a dummy structure located at a corner region of said integrated circuit, said dummy structure comprising:

dummy semiconductor devices and dummy metal lines in the corner regions of said integrated circuits wherein each of said dummy metal lines comprises a plurality of metal layers and wherein a lowest of said plurality of metal layers is connected by metal vias to both one of said dummy semiconductor device and an active area of a semiconductor substrate of said integrated circuit; and wherein said dummy metal lines prevent propagation of cracks in said corner region of said integrated circuit.

20. The integrated circuit according to claim 19 wherein said dummy metal lines comprise copper.

21. The integrated circuit according to claim 19 wherein said metal layers and metal vias comprise copper, aluminum, or tungsten.

22. The integrated circuit according to claim 19 wherein delamination of metal layers during integrated circuit fabrication is also prevented by said dummy metal lines.

23. The integrated circuit according to claim 19 wherein said dummy metal lines comprise an alternating dummy grid structure.

24. The integrated circuit according to claim 19 wherein said dummy metal lines comprise odd and even via stacks connected to alternate metal layers.

25. The integrated circuit according to claim 24 wherein each of said alternate metal layers connects to either said odd via stacks or said even via stacks.

26. The integrated circuit according to claim 19, wherein low dielectric constant dielectric material separates conducting layers from one another.

27. An integrated circuit comprising a dummy structure located at a corner region of said integrated circuit, said dummy structure comprising:

dummy polysilicon semiconductor devices and dummy metal lines in a corner region of said integrated circuit wherein each of said dummy metal lines comprises a plurality of metal layers and wherein a lowest of said plurality of metal layers is connected by metal vias to both one of said dummy polysilicon semiconductor devices and an active area of a silicon substrate of said integrated circuits wherein said dummy metal lines prevent propagation of cracks in said corner region of said integrated circuit.

* * * * *